United States Patent
Tunks et al.

(10) Patent No.: US 11,177,618 B1
(45) Date of Patent: Nov. 16, 2021

(54) SERVER BLIND-MATE POWER AND SIGNAL CONNECTOR DOCK

(71) Applicant: DELL PRODUCTS, LP, Round Rock, TX (US)

(72) Inventors: Eric M. Tunks, Austin, TX (US); Jimmy Koon-Ming Tang, Round Rock, TX (US); Marc Douglas Sayre, Austin, TX (US); Roberto A. Gutierez, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/874,463

(22) Filed: May 14, 2020

(51) Int. Cl.
| | |
|---|---|
| *H01R 12/00* | (2006.01) |
| *H01R 27/02* | (2006.01) |
| *H01R 13/518* | (2006.01) |
| *H01R 43/26* | (2006.01) |
| *H01R 12/72* | (2011.01) |
| *H05K 7/14* | (2006.01) |

(52) U.S. Cl.
CPC ......... *H01R 27/02* (2013.01); *H01R 12/722* (2013.01); *H01R 13/518* (2013.01); *H01R 43/26* (2013.01); *H05K 7/1489* (2013.01); *H05K 7/1491* (2013.01)

(58) Field of Classification Search
CPC .... H01R 12/722; H01R 13/518; H01R 27/02; H01R 43/26; H05K 7/1489; H05K 7/1491
USPC .......................................................... 439/64
See application file for complete search history.

(56) References Cited

U.S. PATENT DOCUMENTS

| | | | | | |
|---|---|---|---|---|---|
| 4,179,724 | A | * | 12/1979 | Bonhomme | H05K 7/1424 361/727 |
| 5,687,063 | A | * | 11/1997 | Chabert | H05K 7/1424 361/726 |
| 5,966,292 | A | * | 10/1999 | Amberg | G06F 1/189 361/730 |
| 6,549,400 | B1 | * | 4/2003 | Medin | H05K 7/1454 312/223.1 |
| 6,927,974 | B2 | * | 8/2005 | Robillard | H01R 13/6315 361/679.4 |
| 7,365,964 | B2 | * | 4/2008 | Donahue, IV | H01R 13/514 361/622 |
| 7,393,249 | B2 | * | 7/2008 | Wagner | H01R 13/506 439/620.24 |
| 8,582,302 | B2 | * | 11/2013 | Peterson | H05K 7/1492 361/724 |
| 8,804,313 | B2 | * | 8/2014 | Peterson | H05K 7/1457 361/622 |

(Continued)

*Primary Examiner* — Abdullah A Riyami
*Assistant Examiner* — Vladimir Imas
(74) *Attorney, Agent, or Firm* — Larson Newman, LLP

(57) ABSTRACT

A server rack includes a server and a connector dock. The server includes first signal connector receptacles and first power connector receptacles. The connector dock includes blind signal connectors that mate with the first signal connector receptacles and blind power connectors that mate with the first power connector receptacles when the server is installed into the server rack. The connector dock further includes second signal connector receptacles facing a back of the server rack, where each second signal connector receptacle is connected to an associated one of the blind signal connectors; and second power connector receptacles facing the back of the server rack, where each second power connector receptacle is connected to an associated one of the blind power connectors.

20 Claims, 6 Drawing Sheets

(56) References Cited

U.S. PATENT DOCUMENTS

| | | | | |
|---|---|---|---|---|
| 8,964,396 | B1 | 2/2015 | Dailey et al. | |
| 9,231,503 | B2* | 1/2016 | Kemper | H02K 11/33 |
| 9,329,654 | B2* | 5/2016 | Hutten | H05K 7/1492 |
| 9,335,786 | B2* | 5/2016 | Stewart | H05K 7/1492 |
| 9,379,614 | B2* | 6/2016 | Meinecke | H05K 7/183 |
| 9,417,664 | B1* | 8/2016 | Dailey | H05K 7/1454 |
| 9,430,010 | B2* | 8/2016 | Palmer | H05K 7/1498 |
| 9,464,854 | B2* | 10/2016 | Shelnutt | H05K 7/20809 |
| 9,678,544 | B2* | 6/2017 | Stewart | H05K 7/1489 |
| 9,699,933 | B2* | 7/2017 | Masuyama | H05K 7/1498 |
| 10,034,407 | B2* | 7/2018 | Miller | G06F 3/0665 |
| 10,206,313 | B1* | 2/2019 | Gold | H05K 7/1491 |
| 10,237,999 | B2* | 3/2019 | Lunsman | H05K 7/20763 |
| 10,250,447 | B2* | 4/2019 | Palmer | H05K 7/20827 |
| 10,396,493 | B2* | 8/2019 | Bowman | H01R 13/622 |
| 10,462,926 | B2* | 10/2019 | Gold | H05K 7/1489 |
| 10,474,460 | B2* | 11/2019 | Adiletta | G02B 6/3893 |
| 10,555,435 | B2* | 2/2020 | White | G06F 11/0769 |
| 10,606,324 | B2* | 3/2020 | Leigh | G06F 1/183 |
| 10,750,633 | B1* | 8/2020 | Gold | H05K 7/183 |
| 10,897,104 | B2* | 1/2021 | Bowman | H01R 13/623 |
| 2004/0150964 | A1* | 8/2004 | Uzuka | H05K 1/14 |
| | | | | 361/760 |
| 2008/0239649 | A1 | 10/2008 | Bradicich et al. | |
| 2012/0243160 | A1* | 9/2012 | Nguyen | G06F 1/1601 |
| | | | | 361/679.08 |
| 2015/0062832 | A1 | 3/2015 | Ismayilov et al. | |
| 2015/0200474 | A1* | 7/2015 | Rossman | H01R 12/91 |
| | | | | 439/64 |
| 2019/0062053 | A1* | 2/2019 | Jensen | G06F 15/7867 |
| 2019/0141845 | A1* | 5/2019 | Prakash | H05K 7/1492 |

* cited by examiner

SERVER BLIND-MATE POWER AND SIGNAL CONNECTOR DOCK

FIELD OF THE DISCLOSURE

This disclosure generally relates to information handling systems, and more particularly relates to providing a server blind-mate power and signal connector dock for an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A server rack may include an element of datacenter equipment installed into at least one rack unit of the server rack, and may be removeable from the server rack. The datacenter equipment may include a plurality of first signal connector receptacles located on a back surface of the datacenter equipment and a plurality of first power connector receptacles located on the back surface of the datacenter equipment. The server rack may further include a connector dock installed into the rack unit of the server rack. The connector dock may include a plurality of blind signal connectors located on a front surface of the connector dock facing the back surface of the datacenter equipment, a plurality of blind power connectors located on the front surface of the connector dock, a plurality of second signal connector receptacles located on a back surface of the connector dock facing a back of the server rack, and a plurality of second power connector receptacles located on the back surface of the connector dock. Each second signal connector receptacle may be connected to an associated one of the blind signal connectors and each second power connector receptacle may be connected to an associated one of the blind power connectors. When the datacenter equipment is installed into the server rack, each one of the blind signal connectors may mate with an associated one of the first signal connector receptacles and each one of the blind power connectors may mate with an associated one of the first power connector receptacles.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
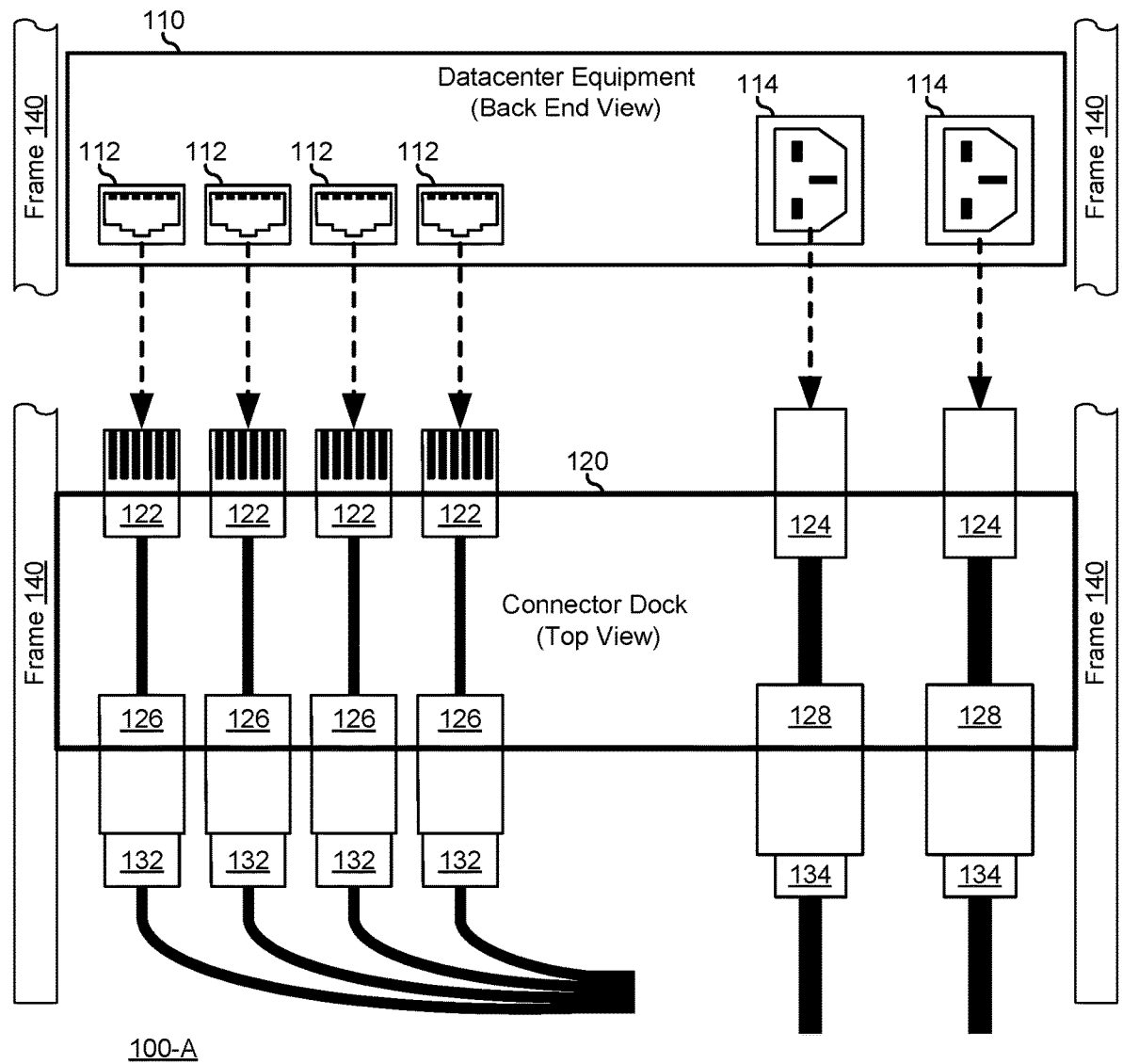
FIG. 1 is a view of a server rack utilizing a power and signal dock according to an embodiment of the present disclosure.
Figure 1:
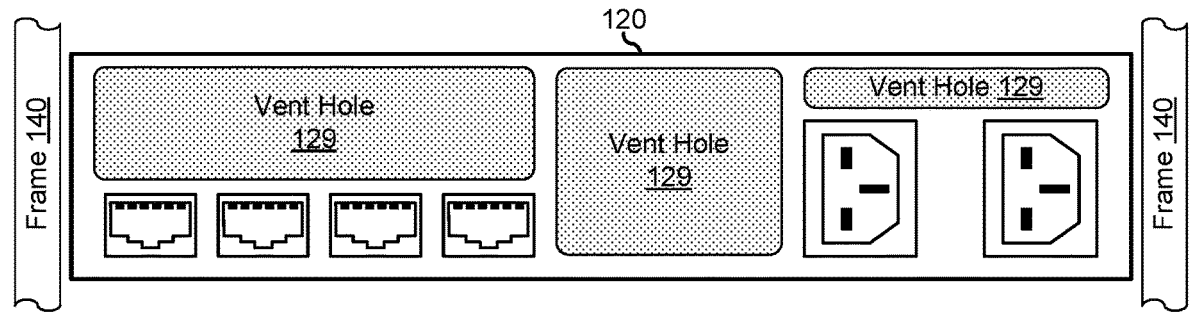

FIG. 1 illustrates a server rack 100 including an element of datacenter equipment 110, a connector dock 120, and a server rack frame 140. Here datacenter equipment 110 is illustrated in an end view, viewing a back end of the datacenter equipment, and connector dock 120 is viewed in a top view. Server rack 110 may include one or more additional elements of datacenter equipment above or below datacenter equipment 110. Server rack 100 includes a rack space that represents a standard server rack, such as a 19-inch rack equipment mounting frame or a 23-inch rack equipment mounting frame, and includes six rack units. The rack units represent special divisions of the rack space that are a standardized unit of, for example, 1.75 inches high. For example, a piece of equipment that will fit into one of the rack units shall herein be referred to as a 1-U piece of equipment, another piece of equipment that takes up two of the rack units is commonly referred to as a 2-U piece of equipment, and so forth. As such, the rack units are numbered sequentially from the bottom to the top as 1U, 2U, 3U, 4U, 5U, and 6U. The skilled artisan will recognize that other configurations for rack units can be utilized, as needed or desired. For example, a rack unit can be defined by the Electronic Components Industry Association standards council.

Datacenter equipment 110 represents a processing element of a datacenter that is housed within server rack 100, and that is physically supported by frame 140. Datacenter equipment 110 will be understood to be removable from server rack 100, and that, to aid in the easy installation and removal of the datacenter equipment, the datacenter equipment may be affixed to frame 140 via sliding rails. Datacenter equipment 110 operates to perform some portion of the data storage and processing functions of the datacenter in which server rack 100 is included. As such, datacenter equipment 110 can be realized as an information handling system.

Datacenter equipment 110 includes various connectors to which cables are connected to provide various types of functionality. As such, datacenter equipment 110 is illustrated as including four (4) signal connector receptacles 112 and two (2) power receptacles 114. While signal connector receptacles 112 are illustrated as Ethernet connector receptacles, it will be understood that the actual signal connector receptacles on a typical element of datacenter equipment may include other types of signal connector receptacles, such as Fibre Channel connector receptacles, Serial-ATA (SATA) connector receptacles, Universal Serial Bus (USB) connector receptacles, serial port connector receptacles, various audio and video connector receptacles, and the like. As such, while signal connector receptacles 112 will be shown and described in the context of Ethernet signal connector receptacles, and Ethernet cables, it will be understood that other types of signal connector receptacles and cables may be utilized as needed or desired, and are consistent with the embodiments disclosed herein. Further, while power receptacles 114 are illustrated as grounded 110V AC power receptacles, it will be understood that the actual power connector receptacles on a typical element of datacenter equipment may include other types of power connector receptacles, such as where an element of datacenter equipment may utilize other power sources at different voltages or that utilize three-phase power. As such, while power connector receptacles 114 will be shown and described in the context of grounded 110V AC power connector receptacles, and the associated cables, it will be understood that other types of power connector receptacles and cables may be utilized as needed or desired, and are consistent with the embodiments disclosed herein.

In a typical datacenter, an element of datacenter equipment will have numerous signal and power cables installed into the signal- and power-connector receptacles, and that the cables, at the back side of a typical server rack, if not carefully managed, may be arranged haphazardly in an arrangement that is not only unsightly, but also inefficient, and potentially dangerous. Moreover, even when a typical server rack has the various cables carefully managed during an initial population of the server rack, subsequent removals, installations, replacements, and the like, of datacenter equipment may, over time, result in a haphazard arrangement of cables. Further, even when the cables at the back side of a typical server rack are carefully managed, nevertheless, the removal or installation of datacenter equipment will typically necessitate the unplugging of all signal and power cables and the subsequent reinstallation of the signal and power cables, leaving the process of cable management as a labor intensive and inefficient activity.

Connector dock 120 is a device that is affixed to frame 140, that includes connector receptacles at a back end for the installation of the power and signal cables at the back side of server rack 100, and that includes blind connectors at a front side, or datacenter equipment side, for insertion into signal connector receptacles 112 and power connector receptacles 114. In particular, at the front side, connector dock 120 includes blind signal connectors 122 that are each engaged with a matching signal connector receptacle 112, and blind power connectors 124 that are each engaged with a matching power connector receptacle 114, when data center equipment 110 is pushed into server rack. Each blind signal connector 122 is connected to a signal connector receptacle 126 at the back side of connector dock 120, and signal cables 132 are installed into the signal connector receptacles. Similarly, each blind power connector 124 is connected to a power connector receptacle 128 at the back side of connector dock 120, and power cables 134 are installed into the power connector receptacles. Blind signal connectors 122 and blind power connectors 124 are referred to as "blind" because they are inserted into the associated signal connector receptacles 112 and power connector receptacles 114 with a mating action that happens via a sliding action which can be accomplished without wrenches or other tools, and that typically has self-aligning features which allows a small misalignment when mating. Moreover, a "blind" connector will be understood to dispense with any locking mechanisms that would lock datacenter equipment 110 together with connector dock 120. For example, where signal connector receptacles 112 and blind signal connectors 122 represent Ethernet connection elements, it will be understood that a locking tab as may typically be found on an Ethernet connector will not be present on the blind signal connectors. Otherwise a difficult process of engaging multiple locking tabs simultaneously would be needed to undock the datacenter equipment from the connector dock.

Where practical, one or more of signal connector receptacles 112 and power connector receptacles 114 may be understood to be in accordance with respective standards for connector receptacle design. For example, where signal connector receptacles 112 and blind signal connectors 122 represent Ethernet connection elements, the signal connector receptacles may be provided in accordance with the relevant electrical and mechanical standards for Ethernet connector receptacles. Here, blind signal connectors 122 may be understood to conform with the relevant electrical and mechanical standards in so far as signal connectivity is concerned, but may deviate from the relevant electrical and mechanical standards by providing such features as may be needed to provide the blind-mating properties. Such features may include a narrowing or tapering of blind signal connectors 122. In other cases, it may not be practical to provide one or more of signal connector receptacles 112 and power connector receptacles 114 in accordance with the respective standards. Here, one or more of connector pairs 112/122 and 114/124 may represent custom blind-mating connector pairs. However, even where one or more of signal connector receptacles 112 and power connector receptacles 114 represent a half of a custom blind-mating connector pair, it will be understood that it would be desirable that the connector receptacles retain compatibility with standard connectors, so that datacenter equipment 110 could be utilized with standard signal cables 132 and standard power cables 134.

Further, it will be understood that each blind signal connector 122 will be collocated with an associated signal connector receptacle 112, and that each blind power connector 124 will be collocated with an associated power connector receptacle 114. Here, the term "collocated" will be understood to refer to a location of a connector receptacle on the back surface of the datacenter equipment being congruent with a location of a blind connector on the front surface of the connector dock. It will be further understood that there may be more signal connector receptacles than blind signal connectors and there may be more power connector receptacles than blind power receptacles, but that additional blind connectors would prevent the docking of the datacenter equipment with the connector dock. As such, a connector dock as shown and described herein may be typically supplied as an accessory to a particular element of datacenter equipment or family of datacenter equipment that shares a common layout for signal connector receptacles and power connector receptacles.

Where practical, one or more of signal connector receptacles 112 and power connector receptacles 114 may be understood to be in accordance with respective standards for connector receptacle design. For example, where signal connector receptacles 112 and blind signal connectors 122 represent Ethernet connection elements, the signal connector receptacles may be provided in accordance with the relevant electrical and mechanical standards for Ethernet connector receptacles. Here, blind signal connectors 122 may be understood to conform with the relevant electrical and mechanical standards in so far as signal connectivity is concerned, but may deviate from the relevant electrical and mechanical standards by providing such features as may be needed to provide the blind-mating properties. Such features may include a narrowing or tapering of blind signal connectors 122. In other cases, it may not be practical to provide one or more of signal connector receptacles 112 and power connector receptacles 114 in accordance with the respective standards. Here, one or more of connector pairs 112/122 and 114/124 may represent custom blind-mating connector pairs. However, even where one or more of signal connector receptacles 112 and power connector receptacles 114 represent a half of a custom blind-mating connector pair, it will be understood that it would be desirable that the connector receptacles retain compatibility with standard connectors, so that datacenter equipment 110 could be utilized with standard signal cables 132 and standard power cables 134.

The functions and features of server rack 100 as shown and described above are with reference to a first portion of FIG. 1 labeled "100-A." A second portion of FIG. 1 labeled "100-B" shows a back view of connector dock 120. Here, connector dock 120 is illustrated as including vent holes 129 that are provided in the connector dock to permit unrestricted airflow through datacenter equipment 110. It will be understood that the front side of connector dock 120 will include vent holes similar to vent holes 129. In a particular embodiment, the back side of datacenter equipment 110 and the front side of connector dock 120 are equipped with one or more pilot mechanism, such as one or more alignment pin/alignment hole arrangement, or the like, as needed or desired to assist in the smooth docking of the datacenter equipment with the connector dock. Connector dock 120 may be constructed as a box with holes stamped into the front and back surfaces to accommodate blind signal connectors 122, blind power connectors 124, signal connector receptacles 126, power connector receptacles 128, and vent holes 129, as needed or desired. Here, connector dock 120 may be constructed of sheet metal, molded plastic, or another material that is suitable to retain blind signal connectors 122, blind power connectors 124, signal connector receptacles 126, and power connector receptacles 128, and of sufficient strength to withstand repeated dockings and undockings.

Figure 2:
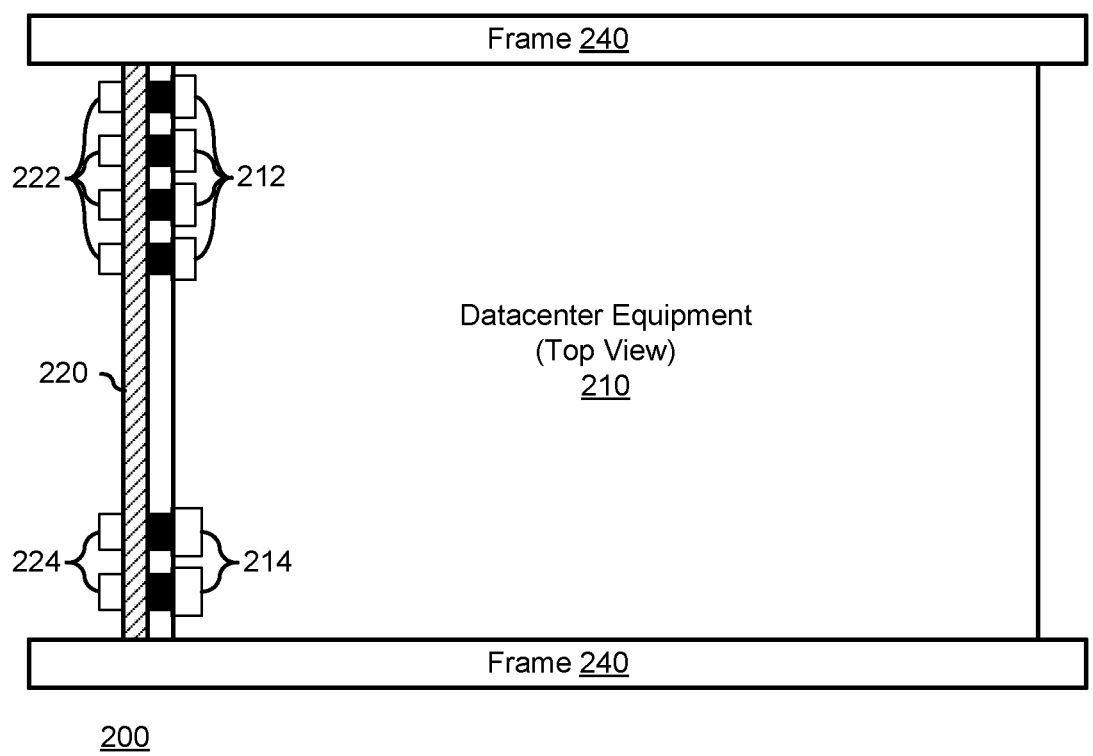
FIG. 2 is a view of a server rack utilizing a power and signal dock according to another embodiment of the present disclosure.

FIG. 2 illustrates a top view of a server rack 200 similar to server rack 100 including an element of datacenter equipment 210 similar to datacenter equipment 110, a connector dock 220 similar to connector dock 120, and a frame 240 similar to frame 140. Here, datacenter equipment 210 includes signal connector receptacles 212 similar to signal connector receptacles 112 and power connector receptacles 214 similar to power connector receptacles 114. Connector dock 220 includes blind signal connectors 222 similar to blind signal connectors 122, blind power connectors 224 similar to blind power connectors 124, signal connector receptacles 226 similar to signal connector receptacles 126, and power connector receptacles 228 similar to power connector receptacles 128. As such, datacenter equipment 210 installs into server rack 200, and docks with connector dock 220 similarly to the embodiment shown in FIG. 1.

Here, connector dock 220 will be understood to have a much thinner depth than connector dock 120. In particular, connector dock 220 is constructed as a single layer of material with blind signal connectors 222, blind power connectors 224, signal connector receptacles 226, and power connector receptacles 228 affixed to their respective sides of the connector dock. For example, connector dock 220 may be constructed of a single sheet of sheet metal with holes stamped into it to accommodate blind signal connectors 222, blind power connectors 224, signal connector receptacles 226, power connector receptacles 228, and vent holes similar to vent holes 129. Here each blind signal connector 222 and associated signal connector receptacle 226 may be constructed as a single piece that is attached to connector dock 220, and each blind power connector 224 can be constructed as a single piece that is attached to the connector dock. In another example, connector dock 220 may be constructed of a printed circuit board (PCB) material. Here, blind signal connectors 222, blind power connectors 224, signal connector receptacles 226, and power connector receptacles 228 can be affixed to connector dock 220 utilizing surface mount techniques, and the blind connectors and associated connector receptacles can be connected together utilizing through-hole vias and signal traces on the PCB material. In this way, connector dock 220 provides a narrower profile than connector dock 120.

Figure 3:
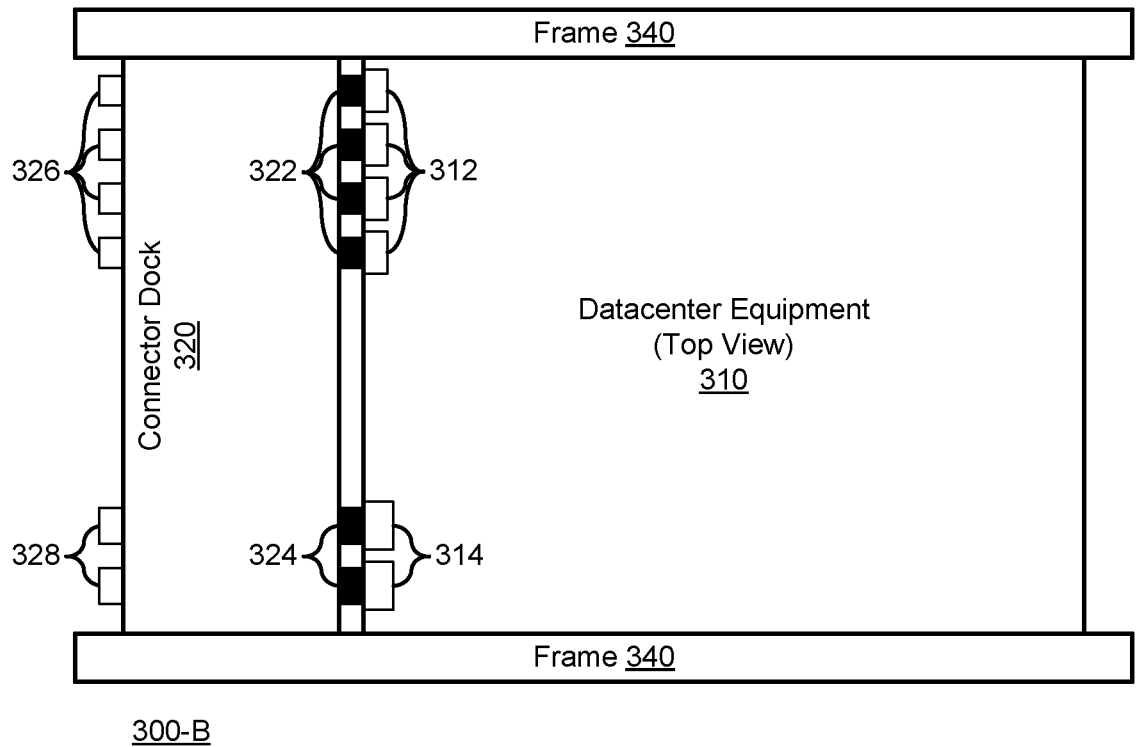
FIG. 3 is a view of a server rack utilizing a power and signal dock according to another embodiment of the present disclosure.
Figure 3:
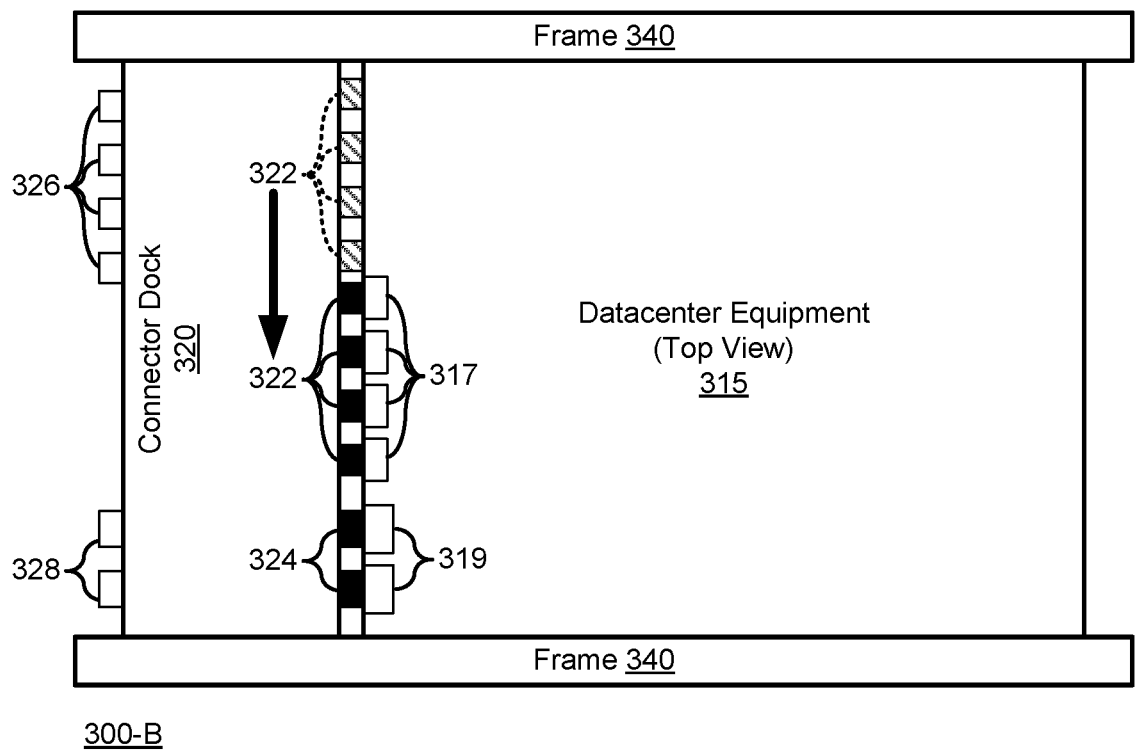

FIG. 3 illustrates two top views of a server rack 300 similar to server rack 100, and labeled "300-A" and "300-B." In a first case, server rack 300 is illustrated as including an element of datacenter equipment 310 similar to datacenter equipment 110, a connector dock 320 similar to connector dock 120, and a frame 340 similar to frame 140. Here, datacenter equipment 310 includes signal connector receptacles 312 similar to signal connector receptacles 112 and power connector receptacles 314 similar to power connector receptacles 114. Connector dock 320 includes blind signal connectors 322 similar to blind signal connectors 122, except as described further below, blind power connectors 324 similar to blind power connectors 124, signal connector receptacles 326 similar to signal connector receptacles 126, and power connector receptacles 328 similar to power connector receptacles 128. As such, datacenter equipment 310 installs into server rack 300, and docks with connector dock 320 similarly to the embodiment shown in FIG. 1.

In a second case, datacenter equipment 310 is removed, and datacenter equipment 315 is installed in its place. Here, datacenter equipment 315 includes signal connector receptacles 317 similar to signal connector receptacles 112 and 312, except that signal connector receptacles 317 are displaced to different locations than signal connector receptacles 112 or 312. Further, datacenter equipment 315 includes power connector receptacles 319 similar to power connector receptacles 114 and 314. Here, connector dock 320 differs from connector dock 120 in that blind signal connectors 322 are moveable to accommodate the different locations of signal connector receptacles 317. Here, datacenter equipment 315 installs into server rack 300, and docks with connector dock 320 similarly to the embodiment shown in FIG. 1, and to the case shown in server rack 100-A. However, prior to the installation of datacenter equipment 315, blind signal connectors 322 must be moved to accommodate the different locations of signal connector receptacles 317. Here, blind signal connectors 322 may be affixed to connector dock 320 via a sliding rail that permits the blind signal connectors to be moved laterally to accommodate the different locations of signal connector receptacles 317. In a first embodiment, all of blind signal connectors 322 are movable as a single unit. In another embodiment, each of blind signal connectors 322 are movable individually.

In this way, connector dock 320 is more flexible in its application than connector dock 120. In particular, certain features may common among different types of data center equipment. For example, a set of four (4) Ethernet connections arranged in a line may be very common for datacenter equipment, or a stack of two (2) lines of four (4) Ethernet connections, for a total of eight (8) Ethernet connections may be very common for datacenter equipment. However the lateral displacement across the back of the datacenter equipment may vary from one type of datacenter equipment to another. In this way, a single type of connector dock may be utilized to accommodate a wider range of datacenter equipment.

Figure 4:
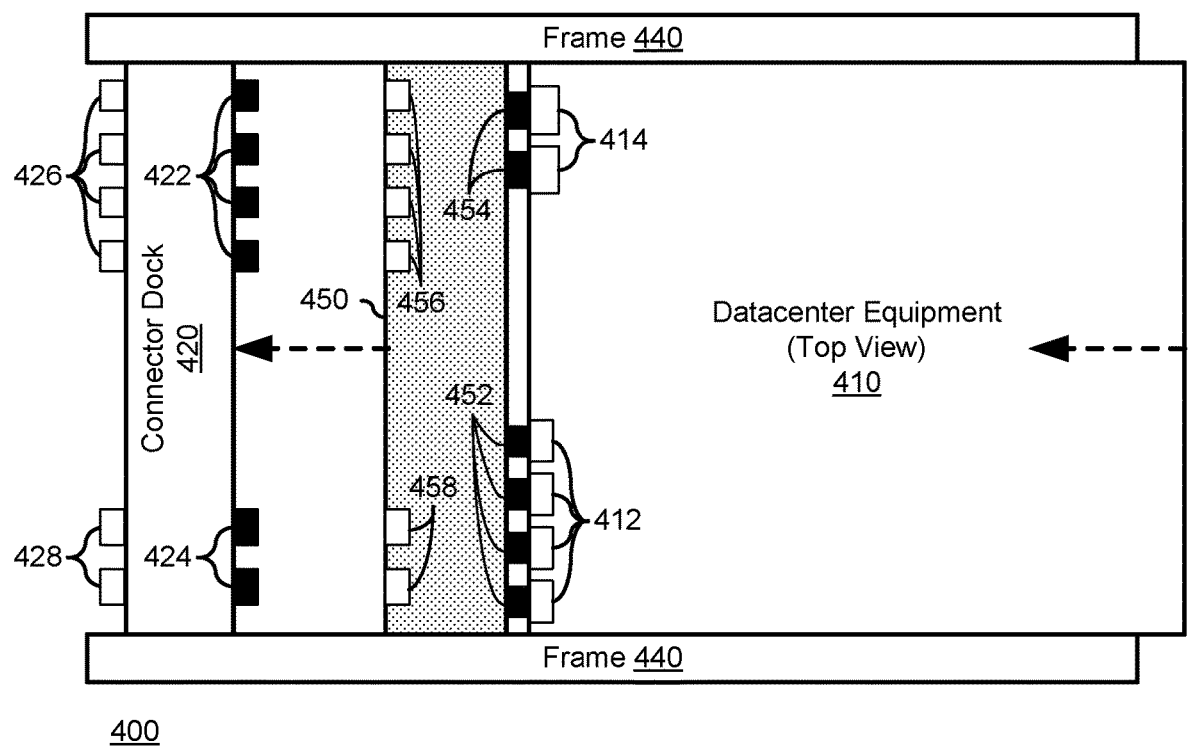
FIG. 4 is a view of a server rack utilizing a power and signal dock according to another embodiment of the present disclosure.

FIG. 4 illustrates a top view of a server rack 400 similar to server rack 100, including an element of datacenter equipment 410 similar to datacenter equipment 110, a connector dock 420 similar to connector dock 120, a frame 440 similar to frame 140, and an interposer 450. Here, datacenter equipment 410 includes signal connector receptacles 412 similar to signal connector receptacles 112 and power connector receptacles 414 similar to power connector receptacles 114, except that the locations of the signal connector receptacles has been swapped with the locations of the power connector receptacles. Here, connector dock 420 includes blind signal connectors 422 similar to blind signal connectors 122, blind power connectors 424 similar to blind power connectors 124, signal connector receptacles 426 similar to signal connector receptacles 126, and power connector receptacles 428 similar to power connector receptacles 128. In particular, blind signal connectors 422 and blind power connectors 424 remain located as are the similar blind signal connectors 122 and blind power connectors 124.

Here, interposer 450 operates to provide connectivity between a "non-standard" connector receptacle arrangement of datacenter equipment 410 and a "standard" blind connector arrangement of connector dock 420. "Standard" and "non-standard," as used herein, is not intended to convey a sense of compliance or non-compliance with a particular electrical or mechanical standard, but rather in the sense of a more commonly available arrangement and a less commonly available arrangement. As such, interposer 450 includes blind signal connectors 452 similar to blind signal connectors 122 and 422, blind power connectors 454 similar to blind power connectors 124 and 424, signal connector receptacles 456 similar to signal connector receptacles 126 and 426, and power connector receptacles 458 similar to power connector receptacles 128 and 428. Here, datacenter equipment 410 is first docked with interposer 450, and then the interposer is mechanically affixed to the datacenter equipment such that the datacenter equipment and the interposer compose a single moveable unit. The moveable unit composed of datacenter equipment 410 and interposer 450 is then installed into server rack 400 and docked with connector dock 420. In this way, a common connectivity pattern at the back of server rack 400 can be provided by multiple elements of datacenter equipment installed into the server rack, even if the installed datacenter equipment does not have the common connectivity pattern.

Moreover, as noted above, there may be cases where it is not practical to provide one or more of the signal connector receptacles and power connector receptacles in accordance with the respective standards, but may need to be a half of a custom blind-mating connector pair. In this case, it will be understood that connector receptacles 412 and 414 are provided in accordance with the relevant standards, and so, interposer 450 permit the use of connector dock 420 by providing that connectors 452 and 454 are also in accordance with the relevant standards, but that one or more of connector receptacles 456 and 458 would need to be an opposing half of the custom blind-mating connector. In this way, a datacenter equipment 410 can still be docked and undocked with connector dock 420, with interposer 450 providing the translation between the standard-mating side with the data center equipment, and the blind-mating side with the connector dock.

Figure 5:
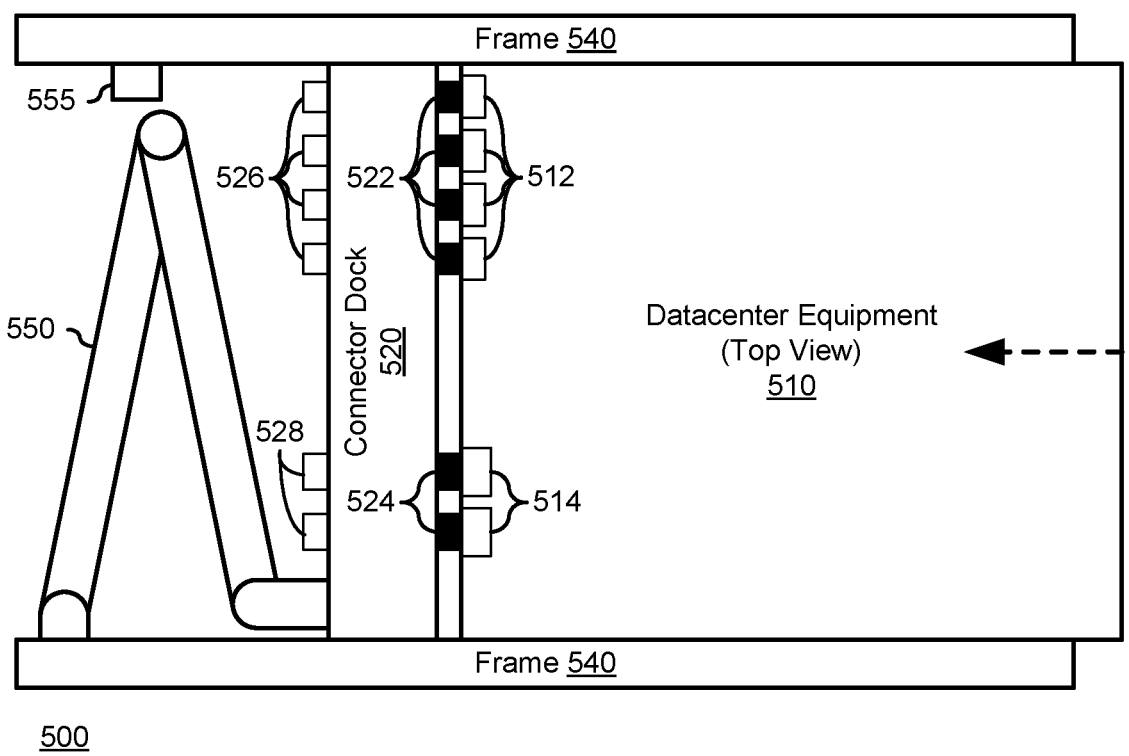
FIG. 5 is a view of a server rack utilizing a power and signal dock according to another embodiment of the present disclosure.

FIG. 5 illustrates a top view of a server rack 500 similar to server rack 100, including an element of datacenter equipment 510 similar to datacenter equipment 110, a connector dock 520 similar to connector dock 120, a frame 540 similar to frame 140, and a Cable Management Arm (CMA) 450. Datacenter equipment 510 includes signal connector receptacles 512 similar to signal connector receptacles 112 and power connector receptacles 514 similar to power connector receptacles 114. Connector dock 520 includes blind signal connectors 522 similar to blind signal connectors 122, blind power connectors 524 similar to blind power connectors 124, signal connector receptacles 526 similar to signal connector receptacles 126, and power connector receptacles 528 similar to power connector receptacles 128. In particular, blind signal connectors 422 and blind power connectors 424 remain located as are the similar blind signal connectors 122 and blind power connectors 124. CMA 550 is affixed at one end to frame 650, and at the other end to connector dock 520. The cables connected at the back of connector dock 520 to signal connector receptacles 526 and to power connector receptacles 528 are routed along the arms of CMA 550, such that datacenter equipment 510 may be partially pulled out from server rack 500 while remaining connected, to enable the datacenter equipment to be serviced without disconnecting the datacenter equipment. In a particular embodiment, frame 540 is provided with a latch 555 that engages with connector dock 520 when datacenter equipment 510 is fully pushed into server rack 500. Latch 555 operates to retain connector dock 520 when datacenter equipment 510 is pulled out from server rack 500, thereby undocking the datacenter equipment from the connector dock.

In a particular embodiment, a connector dock is provided that accommodates only the power connections to an element of datacenter equipment, and not the signal connections. Here, the connector dock will include blind power connectors facing the datacenter equipment, and power connector receptacles on the back side of the connector dock. Here, the connector dock does not extend the whole width of the server rack, but is shortened to the extent needed to handle only the power connections to the datacenter equipment.

Figure 6:
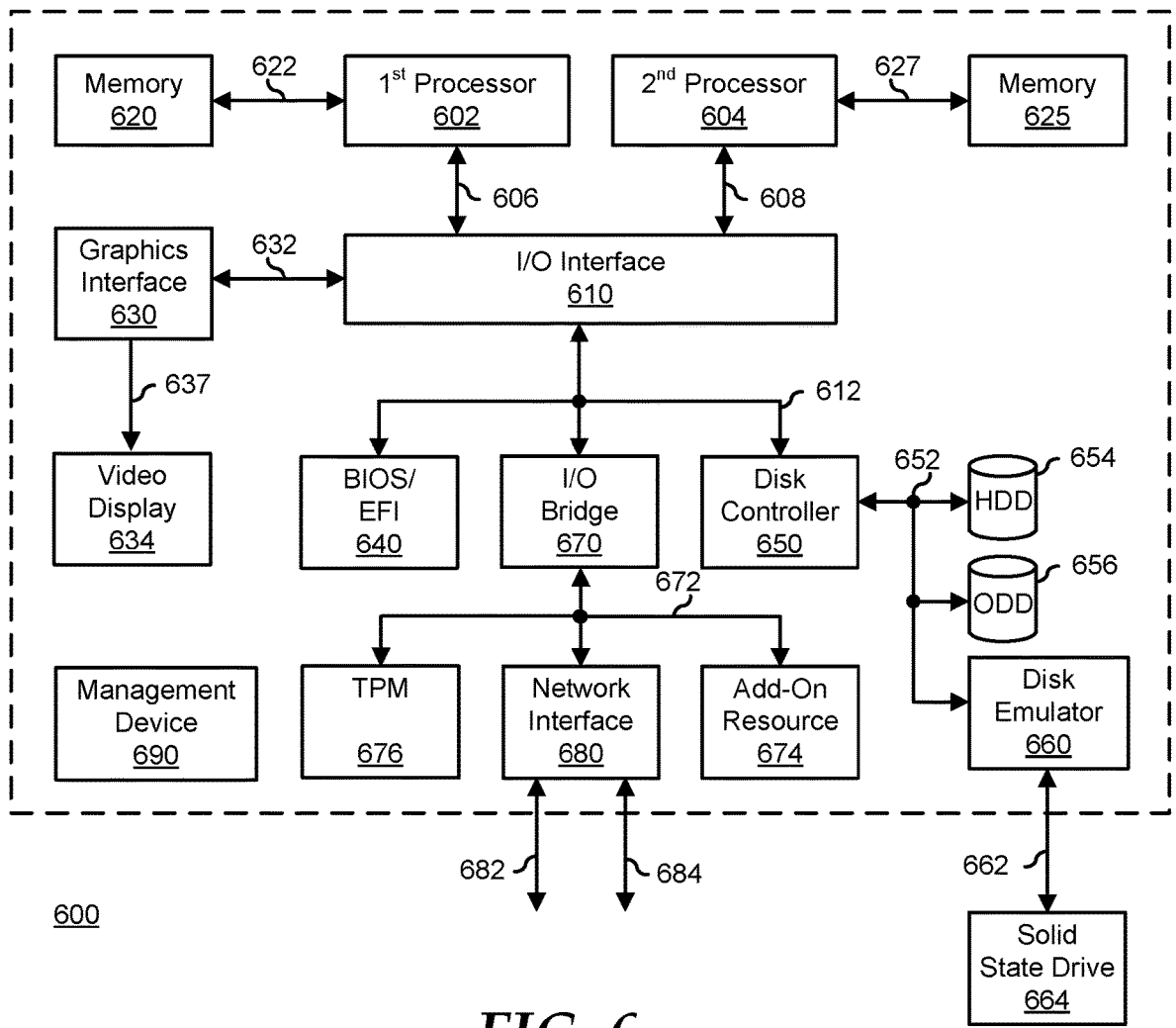
FIG. 6 is a block diagram illustrating a generalized information handling system according to another embodiment of the present disclosure.

FIG. 6 illustrates a generalized embodiment of an information handling system 600 similar to information handling system 100. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 600 can include processing resources for executing machine-executable code, such as a central processing unit (CPU), a programmable logic array (PLA), an embedded device such as a System-on-a-Chip (SoC), or other control logic hardware. Information handling system 600 can also include one or more computer-readable medium for storing machine-executable code, such as software or data. Additional components of information handling system 600 can include one or more storage devices that can store machine-executable code, one or more communications ports for communicating with external devices, and various input and output (I/O) devices, such as a keyboard, a mouse, and a video display. Information handling system 600 can also include one or more buses operable to transmit information between the various hardware components.

Information handling system 600 can include devices or modules that embody one or more of the devices or modules described below, and operates to perform one or more of the methods described below. Information handling system 600 includes a processors 602 and 604, an input/output (I/O) interface 610, memories 620 and 625, a graphics interface 630, a basic input and output system/universal extensible firmware interface (BIOS/UEFI) module 640, a disk controller 650, a hard disk drive (HDD) 654, an optical disk drive (ODD) 656, a disk emulator 660 connected to an external solid state drive (SSD) 662, an I/O bridge 670, one or more add-on resources 674, a trusted platform module (TPM) 676, a network interface 680, a management device 690, and a power supply 695. Processors 602 and 604, I/O interface 610, memory 620, graphics interface 630, BIOS/UEFI module 640, disk controller 650, HDD 654, ODD 656, disk emulator 660, SSD 662, I/O bridge 670, add-on resources 674, TPM 676, and network interface 680 operate together to provide a host environment of information handling system 600 that operates to provide the data processing functionality of the information handling system. The host environment operates to execute machine-executable code, including platform BIOS/UEFI code, device firmware, operating system code, applications, programs, and the like, to perform the data processing tasks associated with information handling system 600.

In the host environment, processor 602 is connected to I/O interface 610 via processor interface 606, and processor 604 is connected to the I/O interface via processor interface 608. Memory 620 is connected to processor 602 via a memory interface 622. Memory 625 is connected to processor 604 via a memory interface 627. Graphics interface 630 is connected to I/O interface 610 via a graphics interface 632, and provides a video display output 636 to a video display 634. In a particular embodiment, information handling system 600 includes separate memories that are dedicated to each of processors 602 and 604 via separate memory interfaces. An example of memories 620 and 630 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 640, disk controller 650, and I/O bridge 670 are connected to I/O interface 610 via an I/O channel 612. An example of I/O channel 612 includes a Peripheral Component Interconnect (PCI) interface, a PCI-Extended (PCI-X) interface, a high speed PCI-Express (PCIe) interface, another industry standard or proprietary communication interface, or a combination thereof. I/O interface 610 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 640 includes BIOS/UEFI code operable to detect resources within information handling system 600, to provide drivers for the resources, initialize the resources, and access the resources. BIOS/UEFI module 640 includes code that operates to detect resources within information handling system 600, to provide drivers for the resources, to initialize the resources, and to access the resources.

Disk controller 650 includes a disk interface 652 that connects the disk controller to HDD 654, to ODD 656, and to disk emulator 660. An example of disk interface 652 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 660 permits SSD 664 to be connected to information handling system 600 via an external interface 662. An example of external interface 662 includes a USB interface, an IEEE 1394 (Firewire) interface, a proprietary interface, or a combination thereof. Alternatively, solid-state drive 664 can be disposed within information handling system 600.

I/O bridge 670 includes a peripheral interface 672 that connects the I/O bridge to add-on resource 674, to TPM 676, and to network interface 680. Peripheral interface 672 can be the same type of interface as I/O channel 612, or can be a different type of interface. As such, I/O bridge 670 extends the capacity of I/O channel 612 when peripheral interface 672 and the I/O channel are of the same type, and the I/O bridge translates information from a format suitable to the I/O channel to a format suitable to the peripheral channel 672 when they are of a different type. Add-on resource 674 can include a data storage system, an additional graphics interface, a network interface card (NIC), a sound/video processing card, another add-on resource, or a combination thereof. Add-on resource 674 can be on a main circuit board, on separate circuit board or add-in card disposed within information handling system 600, a device that is external to the information handling system, or a combination thereof.

Network interface 680 represents a NIC disposed within information handling system 600, on a main circuit board of the information handling system, integrated onto another component such as I/O interface 610, in another suitable location, or a combination thereof. Network interface device 680 includes network channels 682 and 684 that provide interfaces to devices that are external to information handling system 600. In a particular embodiment, network channels 682 and 684 are of a different type than peripheral channel 672 and network interface 680 translates information from a format suitable to the peripheral channel to a format suitable to external devices. An example of network channels 682 and 684 includes InfiniBand channels, Fibre Channel channels, Gigabit Ethernet channels, proprietary channel architectures, or a combination thereof. Network channels 682 and 684 can be connected to external network resources (not illustrated). The network resource can include another information handling system, a data storage system, another network, a grid management system, another suitable resource, or a combination thereof.

Management device 690 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 600. In particular, management device 690 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 600, such as system cooling fans and power supplies. Management device 690 can include a network connection to an external management system, and the management device can communicate with the management system to report status information for information handling system 600, to receive BIOS/UEFI or system firmware updates, or to perform other task for managing and controlling the operation of information handling system 600. Management device 690 can operate off of a separate power plane from the components of the host environment so that the management device receives power to manage information handling system 600 when the information handling system is otherwise shut down. An example of management device 690 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 690 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A server rack, comprising:
  an element of datacenter equipment installed into at least one rack unit of the server rack, and operable to be removeable from the server rack, wherein the datacenter equipment includes a plurality of first signal connector receptacles located on a back surface of the datacenter equipment and a plurality of first power connector receptacles located on the back surface of the datacenter equipment;
  a connector dock installed into the rack unit of the server rack, the connector dock including:
    a plurality of blind signal connectors located on a front surface of the connector dock facing the back surface of the datacenter equipment, wherein a number of blind signal connectors is equal to or less than a number of first signal connector receptacles;
    a plurality of blind power connectors located on the front surface of the connector dock, wherein a number of blind power connectors is equal to or less than a number of first power connector receptacles;
    a plurality of second signal connector receptacles located on a back surface of the connector dock facing a back of the server rack, wherein each second signal connector receptacle is connected to an associated one of the blind signal connectors, and wherein each second signal connector receptacle is configured to receive a signal cable from outside the server rack; and
    a plurality of second power connector receptacles located on the back surface of the connector dock, wherein each second power connector receptacle is connected to an associated one of the blind power connectors, and wherein each second power connector receptacle is configured to receive a power cable from outside the server rack;
  wherein, when the datacenter equipment is installed into the server rack, each one of the blind signal connectors mates with an associated one of the first signal connector receptacles and each one of the blind power connectors mates with an associated one of the first power connector receptacles.

2. The server rack of claim 1, wherein the connector dock is affixed to the server rack.

3. The server rack of claim 2, wherein the connector dock is constructed as a box, wherein the blind signal connectors and the blind power connectors are affixed to the front side of the connector dock, and the second signal connector receptacles and the second power connector receptacles are affixed to the back side of the connector dock.

4. The server rack of claim 2, wherein the connector dock is constructed as a flat sheet.

5. The server rack of claim 4, wherein the each blind signal connector and its associated second signal connector receptacle is constructed as a single signal connector element and each blind power connector and its associated second power connector receptacle is constructed as a single power connector element, and wherein each signal connector element is affixed through the flat sheet and each power connector element is affixed through the flat sheet.

6. The server rack of claim 4, wherein the flat sheet comprises a printed circuit board material, wherein each blind signal connector and each blind power connector is surface mount attached on the front side of the flat sheet, and each second signal connector receptacle and each second power connector receptacle is surface mount attached on the back side of the flat sheet.

7. The server rack of claim 1, wherein the blind signal connectors are affixed to the front surface of the connector dock so as to be adjustable in their location on the front surface of the connector dock.

8. The server rack of claim 7, wherein the blind signal connectors are adjusted by sliding the blind signal connectors in a rail.

9. The server rack of claim 1, further comprising:
a cable management arm affixed at a first end to the server rack and affixed at a second end to the connector dock.

10. The server rack of claim 9, further comprising:
a latch configured to engage the connector dock such that when the latch is in a first position, the connector dock remains mated to the data center equipment when the datacenter equipment is slid outward from the front of the server rack extending the cable management arm, and when the latch is in a second position, the connector dock unmates from the datacenter equipment when the datacenter equipment is slid outward from the front of the server rack.

11. A method, comprising:
providing, in at least one rack unit of a server rack, a connector dock;
locating a plurality of blind signal connectors on a front surface of the connector dock facing a back surface of an element of datacenter equipment installed into the at least one rack unit of the server rack;
locating a plurality of blind power connectors on the front surface of the connector dock,
locating a plurality of first signal connector receptacles on a back surface of the connector dock facing a back of the server rack, wherein each first signal connector receptacle is connected to an associated one of the blind signal connectors, and wherein each first signal connector receptacle is configured to receive a signal cable from outside the server rack;
locating a plurality of first power connector receptacles on the back surface of the connector dock, wherein each first power connector receptacle is connected to an associated one of the blind power connector, and wherein each first power connector receptacle is configured to receive a power cable from outside the server rack;
installing the element of datacenter equipment into the server rack, wherein datacenter equipment includes a plurality of second signal connector receptacles located on a back surface of the datacenter equipment, and a plurality of second power connector receptacles located on the back surface of the datacenter equipment, wherein a number of blind signal connectors is equal to or less than a number of second signal connector receptacles, and wherein a number of blind power connectors is equal to or less than a number of second power connector receptacles;
wherein in installing the element of datacenter equipment, the method further comprises:
mating each one of the blind signal connectors with an associated one of the first signal connector receptacles; and
mating each one of the blind power connectors with an associated one of the first power connector receptacles.

12. The method of claim 11, further comprising:
affixing the connector dock to the server rack.

13. The method of claim 12, further comprising:
constructing the connector dock as a box;
affixing the blind signal connectors and the blind power connectors to the front side of the connector dock; and
affixing the first signal connector receptacles and the first power connector receptacles to the back side of the connector dock.

14. The method of claim 12, further comprising:
constructing the connector dock as a flat sheet.

15. The method of claim 14, wherein the each blind signal connector and its associated first signal connector receptacle is constructed as a single signal connector element and each blind power connector and its associated first power connector receptacle is constructed as a single power connector element, the method further comprising:
affixing each signal connector element through the flat sheet; and
affixing each power connector element through the flat sheet.

16. The method of claim 14, wherein the flat sheet comprises a printed circuit board material, the method further comprising:
surface mount attaching each blind signal connector and each blind power connector on the front side of the flat sheet; and
surface mount attaching each first signal connector receptacle and each first power connector receptacle on the back side of the flat sheet.

17. The method of claim 11, further comprising:
affixing the blind signal connectors to the front surface of the connector dock so as to be adjustable in their location on the front surface of the connector dock.

18. The method of claim 17, wherein affixing the blind signal connectors to be adjustable, the method further comprises:
sliding the blind signal connectors in a rail.

19. The method of claim 11, further comprising:
affixing a cable management arm at a first end to the server rack; and
affixing the cable management arm at a second end to the connector dock.

20. A connector dock installed into at least one rack unit of a server rack, the connector dock comprising:
a plurality of blind signal connectors located on a front surface of the connector dock facing the back surface of an element of datacenter equipment installed into the server rack;
a plurality of blind power connectors located on the front surface of the connector dock;
a plurality of first signal connector receptacles located on a back surface of the connector dock facing a back of the server rack, wherein each first signal connector receptacle is connected to an associated one of the blind signal connectors, and wherein each first signal connector receptacle is configured to receive a signal cable from outside the server rack; and
a plurality of first power connector receptacles located on the back surface of the connector dock, wherein each first power connector receptacle is connected to an associated one of the blind power connectors, and wherein each first power connector receptacle is configured to receive a power cable from outside the server rack;
wherein, when the datacenter equipment is installed into the server rack, each one of the blind signal connectors mates with an associated one of a plurality of second signal connector receptacles of the datacenter equipment, and each one of the blind power connectors mates with an associated one of a plurality of second power connector receptacles of the datacenter equipment.

\* \* \* \* \*